United States Patent [19]

Smith

[11] Patent Number: 5,304,875
[45] Date of Patent: Apr. 19, 1994

[54] EFFICIENT TRANSISTOR DRIVE CIRCUIT FOR ELECTRICAL POWER CONVERTER CIRCUITS AND THE LIKE

[75] Inventor: David A. Smith, Kowloon, Hong Kong

[73] Assignee: Astec International, Ltd., Hong Kong

[21] Appl. No.: 875,753

[22] Filed: Apr. 28, 1992

[51] Int. Cl.⁵ .................... H03K 3/01; H02M 3/335
[52] U.S. Cl. .................... 307/571; 307/296.1; 363/21
[58] Field of Search ............... 307/296.1, 571; 363/21, 363/56

[56] References Cited

U.S. PATENT DOCUMENTS

| | | | |
|---|---|---|---|
| 4,899,065 | 2/1990 | Nakamura | 307/571 |
| 5,014,178 | 5/1991 | Balakrishnan | 363/21 |
| 5,146,394 | 9/1992 | Ishii et al. | 363/21 |
| 5,189,599 | 2/1993 | Messman | 363/21 |

FOREIGN PATENT DOCUMENTS 0025169  2/1982  Japan .................... 363/21

Primary Examiner—William L. Sikes
Assistant Examiner—Toan Tran
Attorney, Agent, or Firm—McCubbrey, Bartels & Ward

[57] ABSTRACT

A efficient circuit for driving two switching transistors of an electrical power transfer circuit in an anti-phase relationship is described. The drive circuit is applied to a power transfer circuit, such as a switching-type power converter, having a first switching transistor, a second switching transistor, and a magnetic storage element electrically coupled to the first switching transistor. The first switching transistor is coupled to the magnetic storage element and operates to vary the magnetic flux in the storage element. The present invention comprises a drive circuitry for operating the first switching transistor, the drive circuitry being responsive to a first control signal generated by the power transfer circuit. For driving the second switching transistor, the present invention comprises circuitry for generating a second control signal as a function of the magnetic flux in the magnetic storage element. The second control signal causes the second switching transistor to be conductive when the first switching transistor becomes non-conductive. The present invention further comprises a shunting circuitry responsive to the first control signal for causing the second switching transistor to be non-conductive when the first switching transistor becomes conductive. The circuitry for generating the second control signal and the shunting circuitry of the present invention may be constructed from components requiring less board area than standard drive circuitry for the second switching transistor.

15 Claims, 6 Drawing Sheets

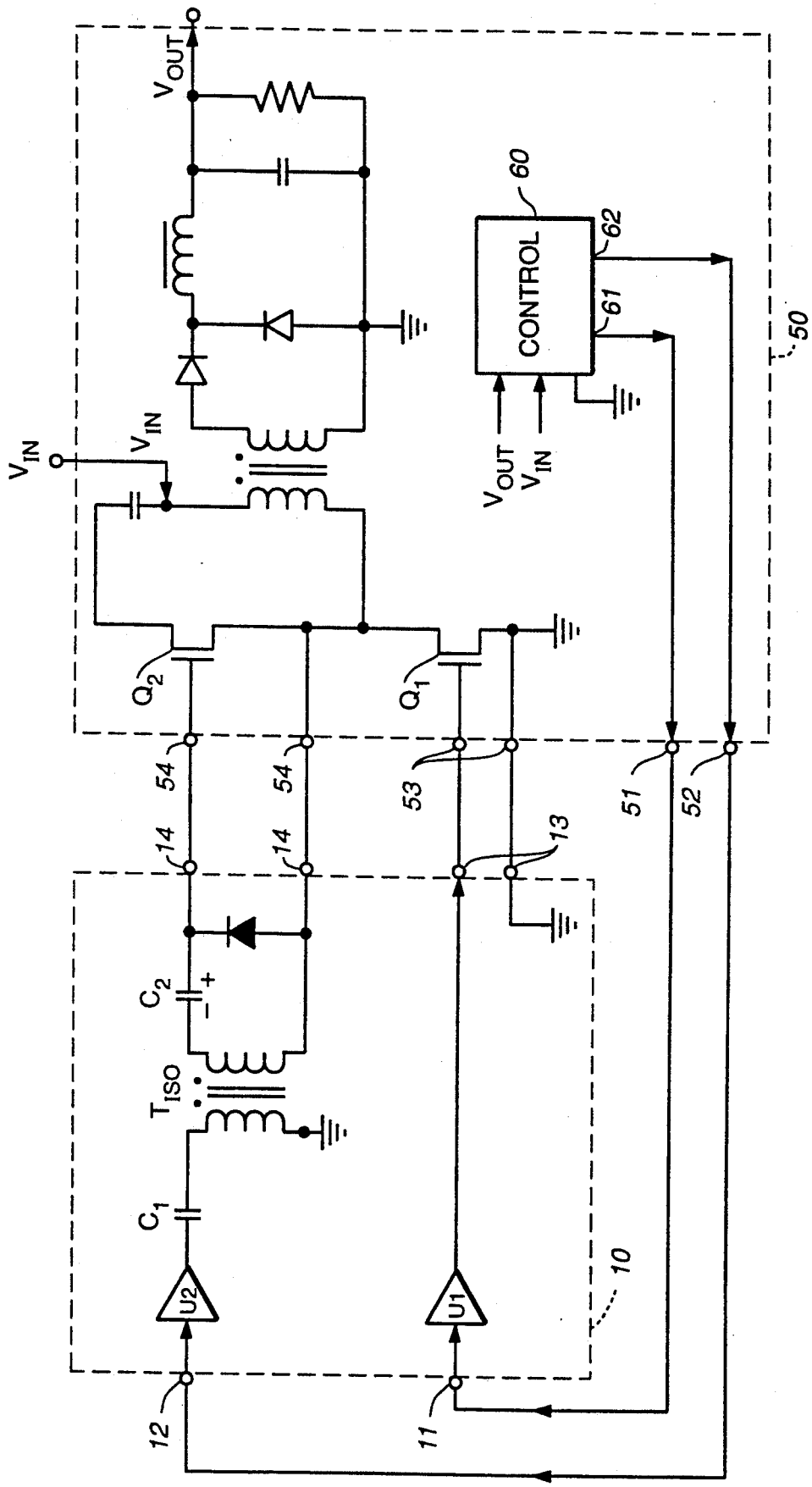
FIG._1 (PRIOR ART)

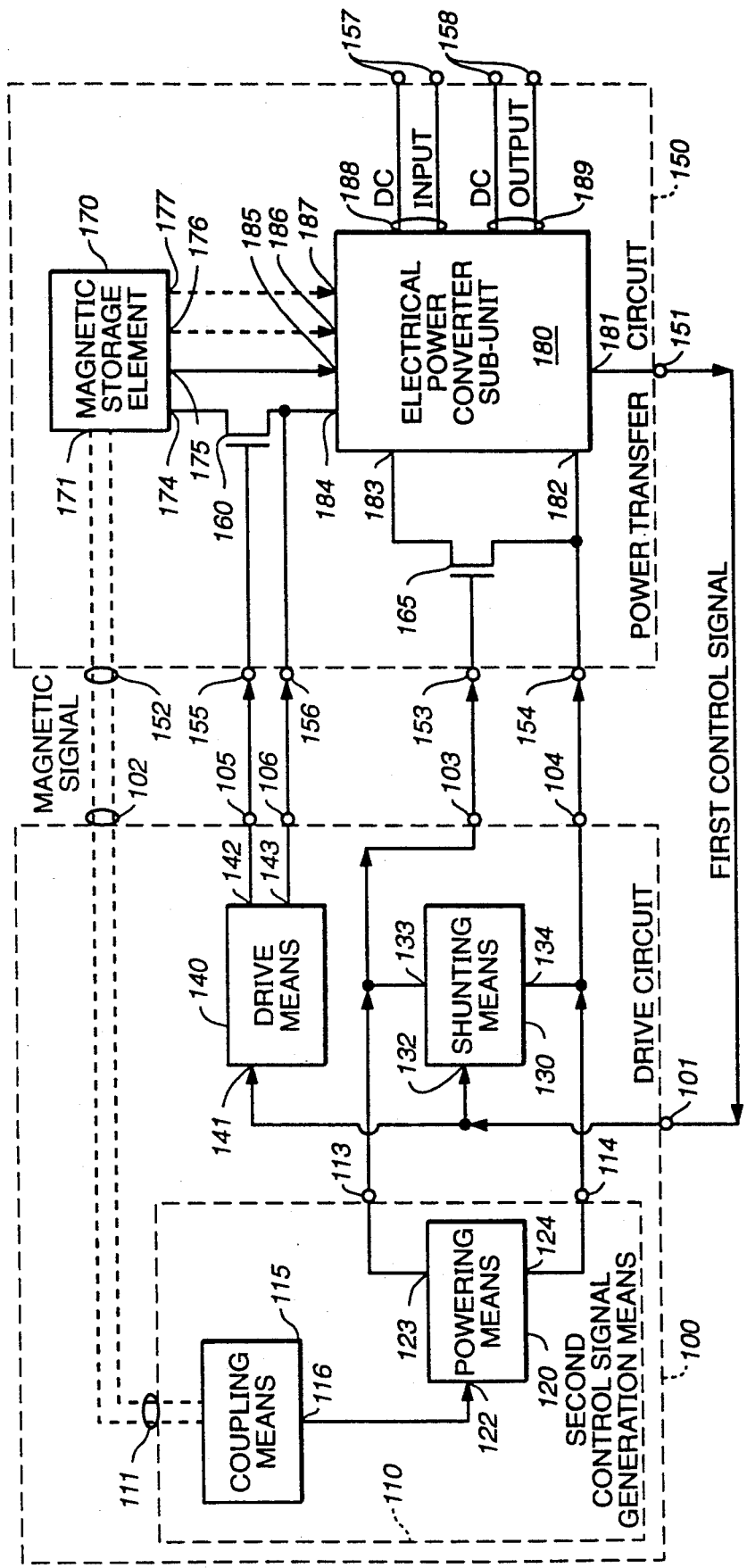
FIG._2

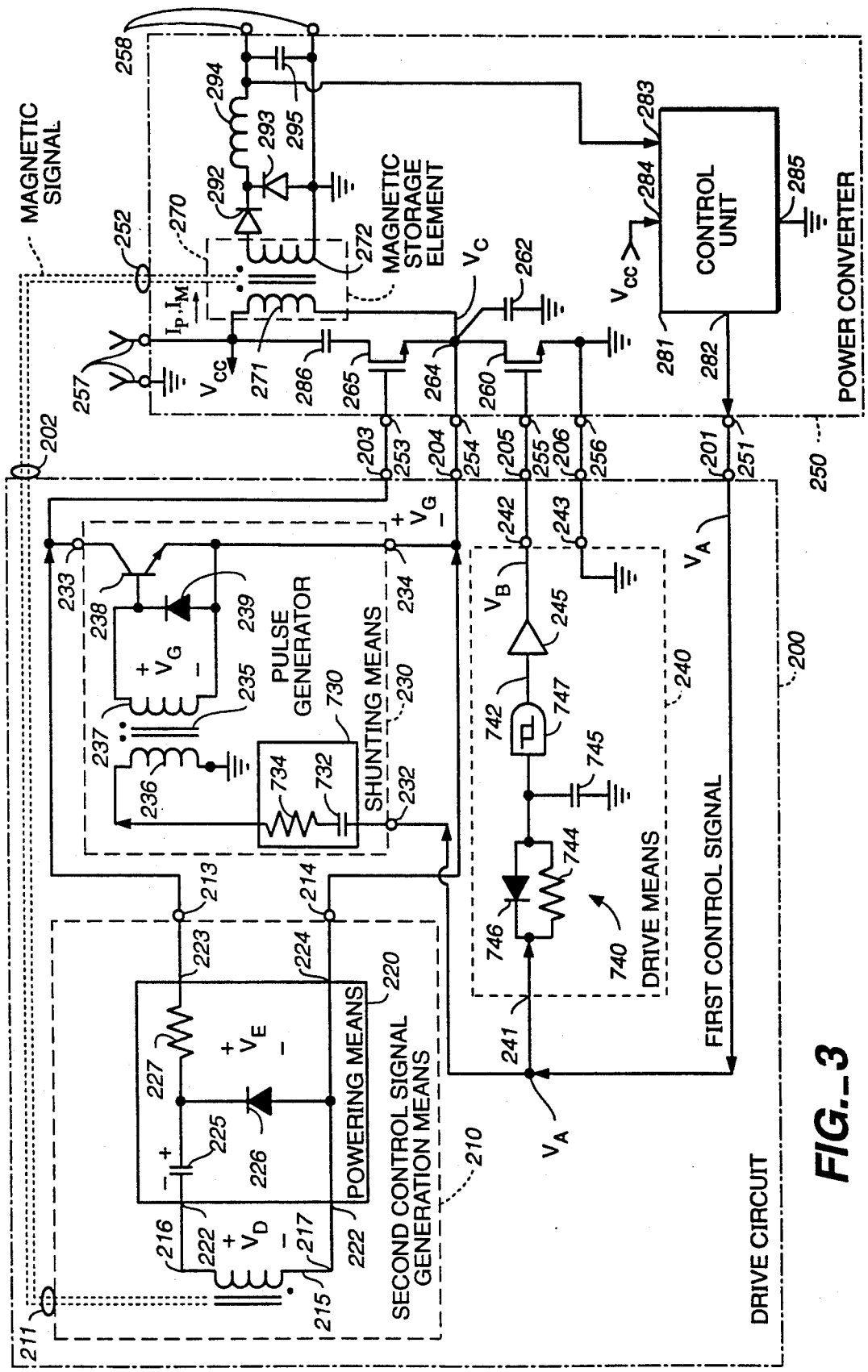
FIG._3

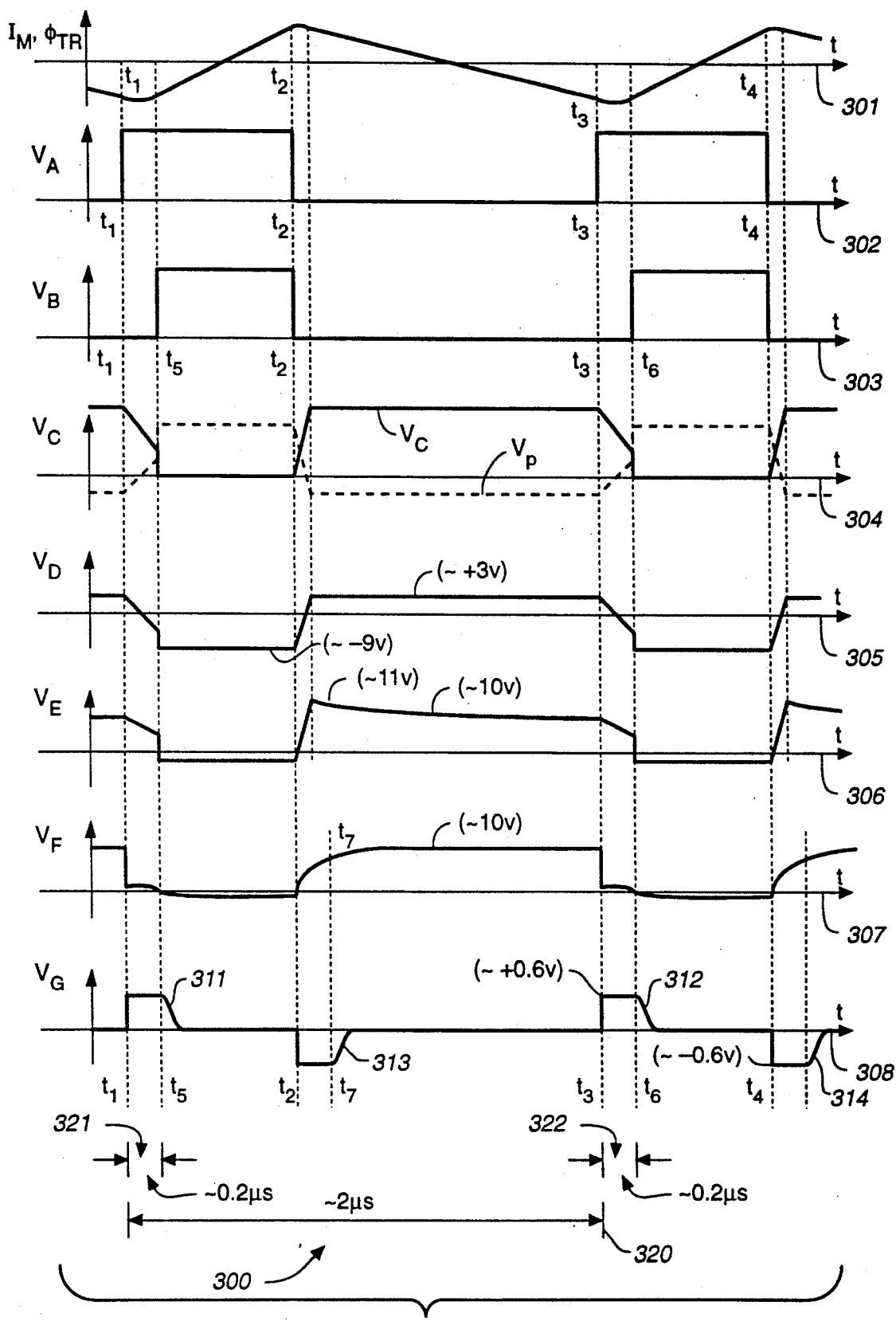
FIG._4

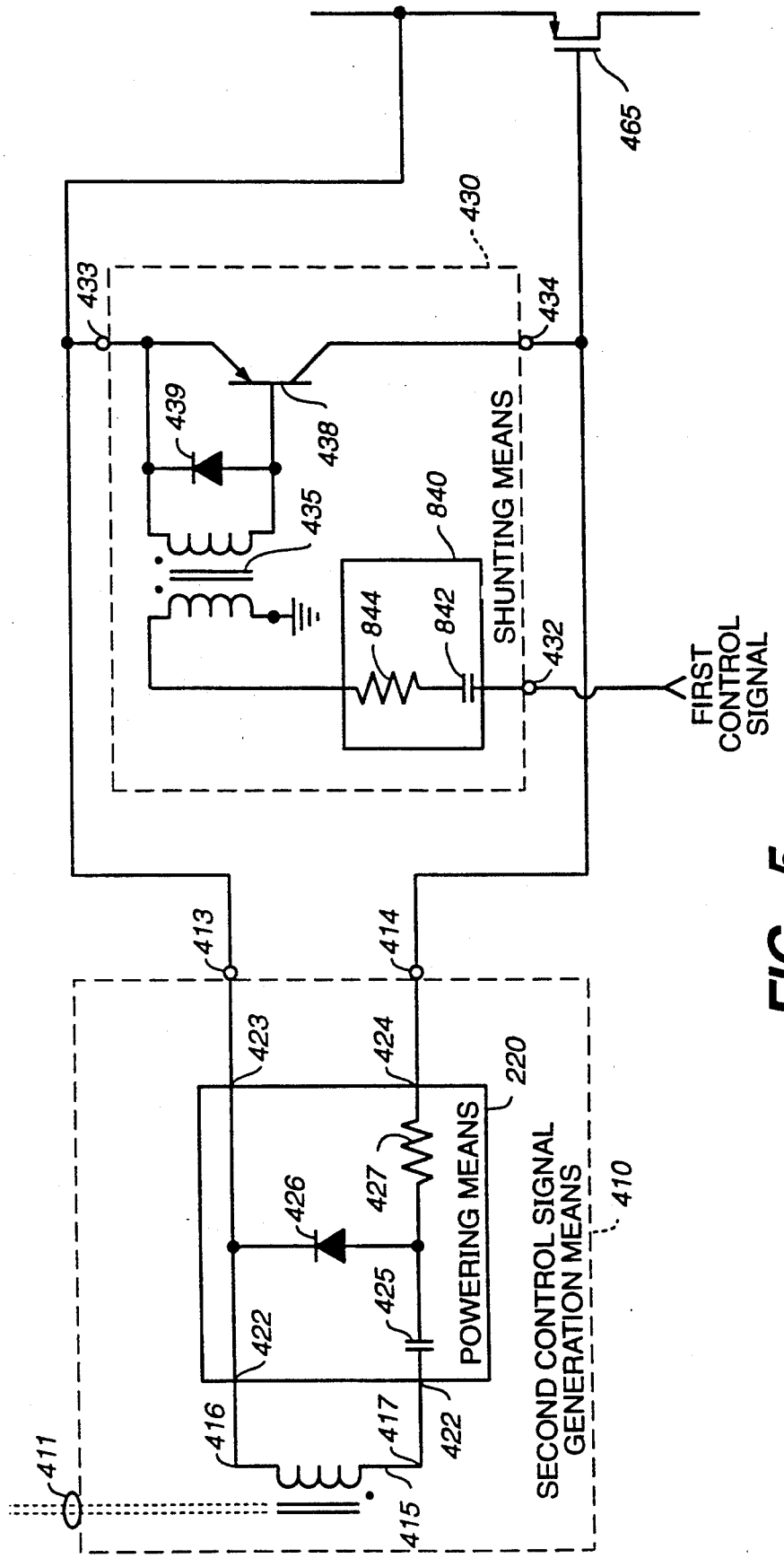
FIG._5

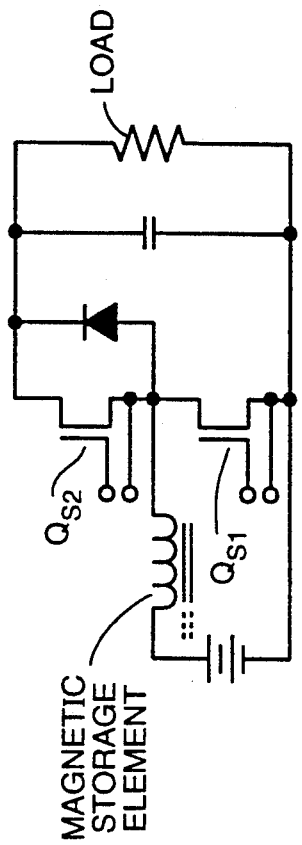
FIG._6B
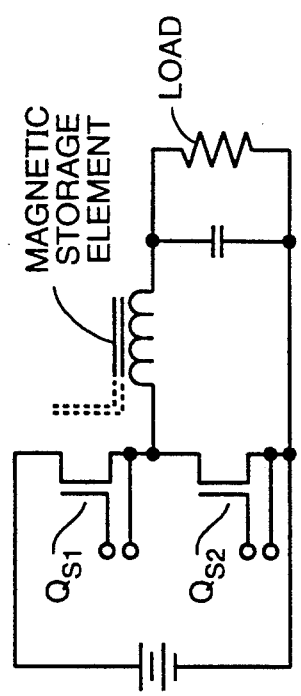
FIG._6A
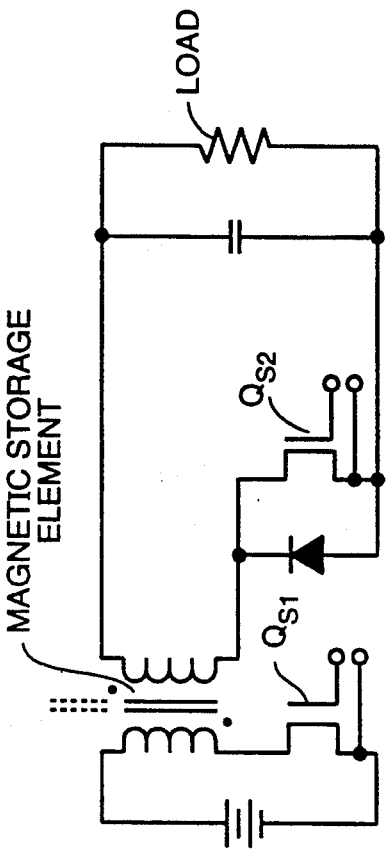
FIG._6D
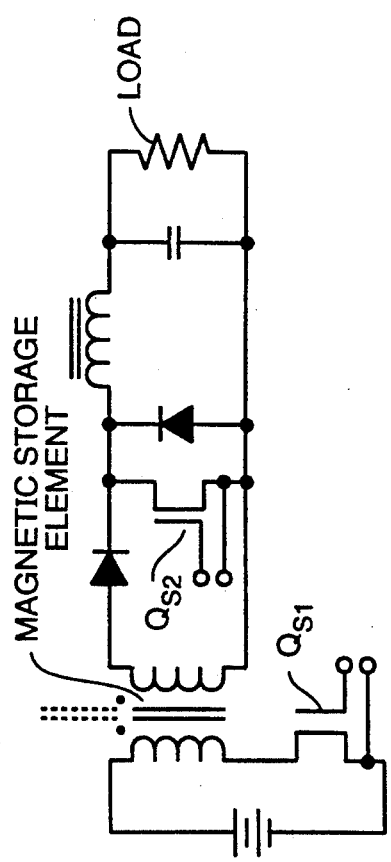
FIG._6C

EFFICIENT TRANSISTOR DRIVE CIRCUIT FOR ELECTRICAL POWER CONVERTER CIRCUITS AND THE LIKE

FIELD OF THE INVENTION

The present invention relates to drive circuits for transistor switching devices in electrical power converters, such as switching power supplies and the like.

BACKGROUND OF THE INVENTION

Power converters such as DC-to-DC voltage converters, DC-to-AC power inverters, and the like, generally use one or more power switching transistor devices and one or more magnetic storage elements in the power conversion process. Examples of such converters are: buck converters, boost converters, forward converters, and flyback converters. Such power converters generally have control circuitry for operating the switching transistors and generally use the magnetic storage elements to store, transfer, and/or transform power from an input source to an output source. Many of these converters have two power switching transistors operating in an anti-phase relationship to one another. Specifically, one such switching transistor usually operates to couple power to the magnetic storage element from the input power source while the other switching transistor may be used to recycle surplus stored energy in the magnetic storage element back to the input supply. Alternately, as a second example, the second switch may act as a synchronous rectifier on the secondary side of the magnetic storage element. Such power converters typically provide conversions at power levels of 50 W and above. The power switching transistors in such converters are relatively large devices in comparison with general-purpose transistors and, therefore, have relatively high gate capacitances.

Typically, these power transistors are switched at frequencies of 250 kHz to 2 MHz. Given this relatively high frequency for power transistor devices and the relatively high gate capacitances, switching power converters generally have large heavy-duty drive circuits for switching these power transistors. Such a drive circuit may typically comprise a large high-powered buffer amplifier and an isolation transformer coupled between the buffer amplifier and power transistor through one or more blocking capacitors. Additionally, as noted above, many power converters have two such power switching transistors operating in an anti-phase relationship, thus requiring two such transistor drive circuits. However, one of the two switching transistors usually does not require a corresponding isolation transformer because it and its corresponding drive circuit operate in the same range of voltage. In such cases, only one of the two drive circuits will require an isolation transformer and corresponding blocking capacitors.

Due to increases in operating frequency and improvements in magnetic storage elements, switching power converters have now evolved to the point that the commonly-used power transistor drive circuits occupy substantial "board" area (or cubic volume) of the power converter and add significant costs to the manufacturing of such power converters. Therefore, there is a significant need in the switching-power supply industry to reduce the costs and "board" area of these circuits.

SUMMARY OF THE INVENTION

Broadly stated, the present invention recognizes that the magnetic storage element of switching-type power converters, and other such power transfer circuits, are potential sources of switching signals for driving switching power transistors used therein. Furthermore, the present invention recognizes that such magnetic storage elements can supply sufficient energy and power to a selected switching power transistor for switching without the need for a buffer amplifier and an isolation transformer. As indicated above, many power converters and power transfer circuits comprise two power switching transistors operating in an anti-phase relationship to one another, with at least one of these switching transistors electrically coupled to such a magnetic storage element. The present invention further recognizes that one of these switching transistors may be operated to control the energy stored in such a magnetic storage element such that the energy may be used to selectively switch the other of the switching transistors in an anti-phase relationship. In this way, the need for the buffer amplifier isolation transformer for one of the two switching transistors may be eliminated. In so doing, the present invention provides means for reducing the board area and cost of switching power converters and the like.

More specifically, the present invention is applicable to a power transfer circuit, such as a switching-type power converter and the like, having a first switching transistor, a second switching transistor, and a magnetic storage element electrically coupled to the first switching transistor. Each switching transistor has a first conduction terminal, a second conduction terminal, a control terminal, a conductive state where current may be conducted between the first and second conduction terminals, and a non-conductive state where current is prevented from being conducted from the first and second conduction terminals. The first and second switching transistors are operated in an anti-phase relationship to one another. Preferably, the power transfer circuit receives power from an input source and transfers power to an output supply using the magnetic storage element.

The present invention encompasses a novel drive circuit for driving the first and second switching transistors in an anti-phase relationship. The present invention comprises means for receiving a first control signal for driving the first switching transistor. The first control signal has a first state (ON state) and a second state (OFF state). The first control signal alternates between its first state (ON state) and its second state (OFF state). The drive circuit of the present invention further comprises means for coupling the first control signal to the control terminal of the first switching transistor. The first control signal causes the first switching transistor to be conductive when the first control signal is in its first state (ON state) and to be non-conductive when the first control signal is in its second state (OFF state). The magnetic storage element of the power transfer circuit is responsive to the conductive state of the first switching transistor such that the magnitude of the magnetic flux of the magnetic storage element increases when the first switching transistor is conductive and decreases when the first switching transistor is non-conductive.

The present invention further comprises means for generating a second control signal responsive to the magnetic flux of the magnetic storage element, the second control signal having a first state and a second state. The second control signal is in its first state when the magnitude of the magnetic flux of the magnetic storage element is increasing and is in its second state when the magnitude of the magnetic flux is decreasing. The means for generating the second control signal includes means for causing the second switching transistor to be conductive when the second control signal is in its second state. In this way, because the second control signal enters its second state substantially when the magnitude of magnetic flux decreases, which in turn occurs substantially when the first switching transistor is non-conductive, the second switching transistor is rendered conductive substantially when the first switching transistor becomes non-conductive. There is preferably sufficient energy in the second control signal, as coupled from the magnetic storage element to the generation means, to enable the generation of a switching signal to the second switching transistor that will retain the second switching transistor in a conductive state for a predetermined period of time.

The present invention further comprises shunting means responsive to the first control signal for causing the second switching transistor to be non-conductive when the first control signal is in its first state (ON state). The shunting means comprises means for coupling the control terminal of the second switching transistor to one of its conduction terminals in response to the first control signal to render the second switching transistor non-conductive. In this way, because the first switching transistor becomes conductive substantially when the first control signal enters its first state (ON state), the second switching transistor is rendered non-conductive substantially when the first switching transistor is rendered conductive. Thus, the first and second switching transistors are operated in an anti-phase relationship.

In a further preferred embodiment of the present invention, the shunting means further comprises a shunting transistor responsive to the first control signal for shunting the control terminal of the second switching transistor to one of the conduction terminals of the second switching transistor. The conduction terminals of the shunting transistor are preferably coupled between the control terminal and one conduction terminal of the second switching transistor. Also in this further embodiment, the shunting means may further comprise a pulse transformer for coupling the first control signal to the control terminal of the shunting transistor. In the present invention, this pulse transformer is enabled to be substantially smaller in size than a typical isolation transformer found in a conventional drive circuit. This is because the high gain of the shunting transistor is capable of shunting a large amount of current through the conduction terminals of the shunting transistor with a small current applied to the control terminal of the shunting transistor.

Accordingly, it is an object of the present invention to reduce the costs and board area requirements of transistor drive circuits which may be used in power transfer circuits, such as electrical power converters and the like.

It is another object of the present invention to utilize the magnetic storage elements of electrical power converters as a source of switching signals.

It is a further object of the present invention to provide a means for driving two power switching transistors of an electrical power converter in an anti-phase relationship.

It is a further object of the present invention to simplify the circuit for driving the second switching transistor by reducing the number of components and by reducing the size of the gate drive transformer.

These and other objects of the present invention will become apparent to those skilled in the art from the following detailed description of the invention and from the accompanying drawings.

BRIEF DESCRIPTION OF THE DRAWINGS

FIG. 1 is a schematic diagram of a transistor drive circuit according to the prior art.

FIG. 2 is a partial block diagram and schematic diagram of a first embodiment of the transistor drive circuit according to the present invention for use in an electrical power transfer/converter circuit.

FIG. 3 is a more detailed schematic diagram of a second embodiment of the transistor drive circuit according to the present invention.

FIG. 4 is a timing diagram of key voltages of the transistor drive circuit of FIG. 3.

FIG. 5 is a schematic diagram of second embodiments of the generation means and the shunting means according to the present invention.

FIG. 6A is a schematic diagram of an exemplary two FET buck converter adapted for use with the transistor drive circuit according to the present invention.

FIG. 6B is a schematic diagram of an exemplary two FET boost converter adapted for use with the transistor drive circuit according to the present invention.

FIG. 6C is a schematic diagram of an exemplary two FET forward converter with synchronous rectification adapted for use with the transistor drive circuit according to the present invention.

FIG. 6D is a schematic diagram of an exemplary two FET flyback converter with synchronous rectification adapted for use with the transistor drive circuit according the present invention.

DETAILED DESCRIPTION OF THE INVENTION

The features of the present invention may be better appreciated and comprehended with a more detailed description of examples from the prior art area most closely related to the present invention.

FIG. 1 shows a conventional approach for driving two power transistors $Q_1$ and $Q_2$ of an electrical power converter unit 50 (i.e., electrical power transfer circuit) in an anti-phase relationship. Power converter unit 50 has a control unit 60 for generating two control signals to operate transistors $Q_1$ and $Q_2$, respectively, which are provided at two outputs 61 and 62, respectively. The signals at ports 61 and 62 are usually of limited drive capability (low current drive and low slew-rate), and thus require power amplification by drive circuit 10. For this, drive circuit 10 has an input port 11 coupled to output 61 for receiving the control signal for transistor $Q_1$, an input port 12 coupled to output 62 for receiving the control signal for transistor $Q_2$, an output port 13 coupled to the gate of transistor $Q_1$ for providing a drive signal thereto, and an output port 14 coupled to the gate of transistor $Q_2$ for providing a drive signal thereto. Converter unit 50 comprises 51, 52, 53, and 54 for coupling to ports 11, 12, 13, and 14, respectively, of drive circuit 10. When transistor $Q_1$ comprises a MOSFET device, output port 13 is coupled between its gate and source terminals. When transistor $Q_1$ comprises a Bipolar (BJT) device, output port 13 is coupled between its base and emitter terminals. A similar statement applies to transistor $Q_2$ and output port 14.

The prior art drive circuit of FIG. 1 further comprises a first buffer amplifier $U_1$ for amplifying the control signal for transistor $Q_1$. The control signal at port 61 is applied to the input of amplifier $U_1$ and the output of amplifier $U_1$ is coupled to the gate of transistor $Q_1$. Both transistor $Q_1$ and buffer amplifier $U_1$ are referenced with respect to ground and, as such, a voltage isolation transformer is not needed between the output of amplifier $U_1$ and transistor $Q_1$. To turn off transistor $Q_1$ in response to the control signal at input port 11, amplifier $U_1$ applies a voltage of typically less than 1 V to the gate of transistor $Q_1$. To turn on transistor $Q_1$ in response to the control signal at input port 12, buffer $U_1$ applies a positive voltage of generally +5 to +12 volts to the gate of transistor $Q_1$.

The prior art drive circuit of FIG. 1 further comprises a second buffer amplifier $U_2$ for amplifying the control signal for transistor $Q_2$, an isolation transformer $T_{ISO}$ for providing isolation and voltage-level shifting between the operating voltages used by buffer $U_2$ and the voltage levels applied to transistor $Q_2$, and blocking capacitors $C_1$ and $C_2$ to prevent transformer $T_{ISO}$ from saturating. Amplifier $U_2$ is coupled to the primary winding of transformer $T_{ISO}$ through capacitor $C_1$. The secondary winding of transformer $T_{ISO}$ is coupled to transistor $Q_2$ through capacitor $C_2$ and output port 14. The drive circuit further includes a diode $D_1$ for setting a reference potential level across capacitor $C_2$ during the "OFF" period of amplifier $U_2$ when the output of amplifier $U_2$ is at a low voltage.

To turn off transistor $Q_2$ in response to the control signal at input port 12, amplifier $U_2$ applies a negative voltage of typically $-1$ to $-5$ volts to transformer $T_{ISO}$, which in turn applies a positive voltage across capacitor $C_2$, with diode $D_1$ forward biased and conducting to complete the circuit. With diode $D_1$ forward biased, a voltage of approximately $-0.6$ V is applied between the gate and source terminals of transistor $Q_2$, rendering $Q_2$ non-conducting ("OFF"). To turn on transistor $Q_2$ in response to the control signal at input port 12, buffer $U_2$ applies a positive voltage of generally +5 to +12 volts to the primary winding of transformer $T_{ISO}$, which in turn applies the positive voltage across capacitor $C_2$. The gate-to-source capacitance of transistor $Q_2$ completes the circuit. In this case, diode $D_1$ is reverse biased and does not conduct. The voltage provided to transistor $Q_2$ is the sum of the positive voltage applied by the secondary winding of $T_{ISO}$ plus the positive voltage applied previously to capacitor $C_2$, rendering $Q_2$ conducting ("ON").

The board area, or alternately cubic volume, required by the drive circuit of FIG. 1 is typically at least twice that required by the area for transistors $Q_1$ and $Q_2$. Each of the buffer amplifiers $U_1$ and $U_2$, which generally comprises a push-pull topology and a set of bipolar devices, has a volume of approximately half the cubic volume of one of the switching transistors $Q_1$ and $Q_2$. Isolation transformer $T_{ISO}$ is generally constructed so as to efficiently conduct the large amount of current needed for charging and discharging the gate of $Q_2$. This generally requires windings of large diameter and larger core size. Generally, isolation transformer $T_{ISO}$ has a cubic volume which is approximately the same as that of transistor $Q_2$. Likewise, Capacitors $C_1$ and $C_2$ must also have capacitance values sufficient enough to efficiently conduct this current, and consequently require large capacitance values. The cubic volume of each capacitor is approximately half that of transistor $Q_2$.

The need for large volumetric components in the prior art drive circuit of FIG. 1 is exacerbated by the following two effects. First, the multistage coupling from $C_1$, to $T_{ISO}$, then to $C_2$ reduces the efficiency of coupling current to $Q_2$ and, therefore, requires a large drive capability in the buffer amplifier $U_2$ as well as large component values for $C_1$, $T_{ISO}$, and $C_2$. Second, the voltage dividing action between $C_2$ and the gate capacitance of $Q_1$ requires a capacitance value for $C_2$ greater than approximately twice the gate capacitance of $Q_2$. For the same reason, capacitor $C_1$ has a value comparable to that of $C_2$.

In contrast, the present invention eliminates the need for the large core size of transformer $T_{ISO}$, capacitor $C_1$, and for a large buffer amplifier $U_2$. As indicated above, the present invention recognizes that the magnetic storage elements of electrical power transfer circuits, such as switching-type power converters, are potential sources of switching signals for driving switching power transistors and have sufficient energy and power to switch a selected switching power transistor, such as $Q_2$. In particular, utilizing the pre-existing magnetic storage elements within the application environment (e.g., switching power converter) maximizes the usage of the corresponding magnetic cores, thereby reducing the cubic volume of the drive circuit according to the present invention.

However, the power signals from such magnetic storage elements may not alone provide all the switching specifications for a selected transistor, such as the timing of certain logic transitions required of the selected transistor. For example, such a signal may have an OFF-to-ON transition which closely corresponds to one of the selected transistor's switching specifications but may not have a corresponding ON-to-OFF transition, or vice-versa. This problem is addressed by a further feature of the present invention which comprises means for effecting the transition which does not have a correspondence with the signal from the magnetic storage element. Additionally, as discussed in greater detail below, this further feature of the present invention effects the transition without the need for a buffer amplifier $U_2$ or a large isolation transformer $T_{ISO}$.

Having thus described an exemplary transistor drive circuit according to the prior art and the general approach and benefits of the present invention, the transistor drive circuit according to the present invention is described in greater detail with reference to FIG. 2. A first embodiment of an exemplary drive circuit according to the present invention is shown at 100 in FIG. 2. Drive circuit 100 includes a first port 101 for receiving a first control signal from an application power transfer circuit, a second port 102 for receiving a magnetic signal from the application circuit, a third port having terminals 103 and 104 for providing a first drive signal to a first transistor of the application circuit, and a fourth port having terminals 105 and 106 for providing a second drive signal to a second transistor of the application circuit. As described in greater detail below, drive circuit 100 comprises means for generating a second control signal from the magnetic signal coupled to port 102.

The drive circuit according to the present invention may be practiced with an application power transfer circuit 150, as shown in FIG. 2, which includes a port 157 for receiving input power, preferably at a DC voltage, and an output port 158 for providing an output supply of power, preferably at a DC voltage difference from the input voltage. Power transfer circuit 150 may comprise, for example, a switching-type electrical power converter. Additionally, power transfer circuit 150 comprises a first switching transistor 160, a second switching transistor 165, a magnetic storage element 170 electrically coupled to first switching transistor 160, and power converter sub-unit 180. Sub-unit 180 comprises control means for controlling the switching transistors 160 and 165, as well as power transfer/conversion related components which operate with storage element 170 and switching transistors 160 and 165 to transfer power from input port 157 to output port 158. It may be appreciated that the application of the present invention is not solely limited to such an exemplary DC-to-DC converter and that the present invention may be applied to DC-to-AC converters, AC-to-DC converters, and other power-switching and power-transfer related circuitry.

Each of the switching transistors 160 and 165 has a first conduction terminal, a second conduction terminal, and a control terminal. Current in each switching transistor is conducted between its conduction terminals as a function of the voltage applied between its control terminal and one of its conduction terminals. When the selected transistor is a MOSFET device, this voltage appears between the gate (control) terminal and the source (first conduction) terminal. When the second switching transistor is a BJT device, this voltage appears between the base (control) terminal and the emitter (first conduction) terminal. In operation, each of switching transistors 160 and 165 has a first state for conducting current between its conduction terminals ("ON" state) and a second state for preventing the conduction of current between its conduction terminals ("OFF" state). Also in operation, switching transistors 160 and 165 are operated in an anti-phase relationship such that transistor 165 is conducting when transistor 160 is not conducting and transistor 165 is not conducting when transistor 160 is conducting.

Transfer circuit 150 further includes a first port 151 coupled to first port 101 for providing a first control signal to drive circuit 100 and a second port 152 coupled to port 102 for providing a magnetic signal indicative of the magnetic flux of storage element 170 to drive circuit 100. (As described in greater detail below, drive circuit 100 comprises means for generating a second control signal from the magnetic signal provided by port 152.) Power transfer circuit 150 further includes a third port having terminals 153 and 154 coupled to terminals 103 and 104, respectively, for receiving a transistor drive signal for second switching transistor 165 from drive circuit 100. Power transfer circuit 150 further includes a fourth port having terminals 155 and 156 coupled to terminals 105 and 106, respectively, for receiving a transistor drive signal for first switching transistor 160 from drive circuit 100.

Magnetic storage element 170 preferably comprises a first inductor winding for storing magnetic energy, the first winding having two terminals, each winding terminal coupled to two terminals 174 and 175, respectively, of element 170. The inductive winding of storage element 170 is electrically coupled to first switching transistor 160, as shown in FIG. 2 by the coupling of terminal 174 to a conduction terminal of transistor 160. Additionally, storage element 170 includes a first port 171 coupled to port 152 for outputting a magnetic signal indicative of the magnetic flux in its first inductor winding. In a preferred embodiment of the present invention, the first winding of storage element 170 is preferably surrounded by (e.g., wound about) a core of high permeability material, which increases the energy storage capability of the inductor winding. It may be appreciated the magnetic storage element 170 is capable of having additional inductor windings, as when storage element 170 comprises a power transformer. As shown in FIG. 2, two additional terminals 176 and 177 are indicated with storage element 170 for such an additional second winding.

As indicated above, sub-unit 180 comprises control means for controlling the switching transistors 160 and 165, and power transfer/conversion related components which operate with storage element 170 and switching transistors 160 and 165 to transfer power from input port 157 to output port 158. For this, sub-unit 180 comprises a means for generating the first control signal for operating transistors 160 and 165, and a port 181 for providing the first control signal to drive circuit 100. Port 181 is coupled to port 151 of power transfer circuit 150. The first control signal has a first state (ON state) and a second state (OFF state). The first control signal is generated by this means of sub-unit 180 such that it alternates between its first state (ON state) and second state (OFF state), with the duration of the first state (ON state) being modulated to control the voltage at output port 158.

Additionally, sub-unit 180 includes terminals 182 and 183 for electrically coupling second switching transistor 165 to the components within sub-unit 180, and terminals 184 and 185 for electrically coupling first switching transistor 160 and the first winding of storage unit 170 to the components within sub-unit 180. Terminal 184 is coupled to a conduction terminal of first switching transistor 160 and terminal 185 is coupled to terminal 175 of magnetic storage element 170. Sub-unit 180 may optionally further include terminals 186 and 187 for coupling a second inductor winding of storage element 170 to the components within sub-unit 180. Sub-unit 180 further includes a port 188 for receiving a source of DC power from input port 157 and an output port 189 for supplying DC power to output port 158.

The first control signal is provided to drive circuit 100 by port 101, which comprises means for receiving the first control signal from transfer circuit 150. For driving first switching transistor 160, drive circuit 100 further comprises a drive means 140 for coupling the first control signal to the control terminal of first transistor 160. In a preferred embodiment of the present invention, the first control signal causes first switching transistor 160 to be conductive when the first control signal is in its ON state (first state) and to be non-conductive when the first control signal is in its OFF state (second state). For this, drive means 140 preferably includes an input port 141, two output drive terminals 142 and 143 coupled to terminals 105 and 106, respectively, and a buffer amplifier having an input coupled to input 141 and an output coupled between terminals 142 and 143. An exemplary embodiment of drive means 140 is discussed in greater detail below with reference to FIG. 3. In a preferred embodiment of the present invention, first transistor 160 and the buffer amplifier of drive means 140 are referenced to a common potential, for example ground, so that drive means 140 does not require an isolation transformer and corresponding blocking capacitors.

As indicated above, magnetic storage means 170 is electrically coupled to first switching transistor 160. In operation, magnetic storage means 170, which is preferably an inductor or a transformer, is responsive to the conductive state of first transistor 160 such that the magnitude of the magnetic flux of magnetic storage element 170 increases when first transistor 160 is in its conductive state and decreases when first transistor 160 is in its non-conductive state. In a preferred embodiment of power transfer circuit 150, first switching transistor 160 operates to build up energy in storage element 170 from the input supply at port 157 when transistor 160 is conducting. This built up energy is later transferred to the output supply at port 158 when transistor 160 is not conducting and, preferably, when second switching transistor 165 is conducting.

Drive circuit 100 further comprises a means 110 for generating a second control signal responsive to the magnetic flux of element 170, the second control signal having a first state and a second state. The second control signal is generated such that it is in its first state when the magnitude of the magnetic flux of magnetic storage element 170 is increasing and in its second state when the magnitude of the magnetic flux of element 170 is decreasing. Generation means 110 includes a port 111 coupled to port 102 for receiving a magnetic signal from power transfer circuit 150, the magnetic signal being a function of the magnetic flux, and hence energy, stored in magnetic storage element 170. Generation means 110 further includes a second port having terminals 113 and 114 for providing the second control signal, in electrical form. Additionally, as described in greater detail below, generation means 110 further includes means for causing second switching transistor 165 to be conductive when the second control signal is in its second state.

In a preferred embodiment of the present invention, generation means 110 further includes a coupling means 115 and a powering means 120. Coupling means 115 is magnetically coupled to magnetic storage element 170 and is preferably an inductor winding. Coupling means 115 generates the second control signal in electrical form as a function of the magnetic flux in storage element 170, as indicated above. The second control signal is provided at a port 116 and coupled to powering means 120.

In this preferred embodiment, powering means 120 is responsive to the electrical signal of coupling means 115 and coupled to the control terminal of second transistor 165 for causing second switching transistor 165 to be conductive when the second control signal is in its second state. In this way, because the second control signal enters its second state substantially when the magnitude of magnetic flux of element 170 decreases, which in turn occurs substantially when first switching transistor 160 is non-conductive, second switching transistor 165 is rendered conductive substantially when first switching transistor 160 becomes non-conductive. Powering means 120 includes an input port 122 coupled to output port 116 of coupling means 115 for receiving the second control signal. Powering means 120 further includes two output terminals 123 and 124 coupled to second switching transistor 165 through terminals 103 and 104, respectively. In a preferred embodiment of the present invention, powering means 120 further includes means for coupling power from the second control signal at port 122 to second switching transistor 165 such that power, preferably in the form of a potential difference, is selectively applied between its control terminal and its first conduction terminal to cause a change in conductive state.

In a preferred embodiment of the present invention, powering means 120 receives power from coupling means 115 on a substantially continuous basis, for example throughout a substantial portion of circuit 150's switching cycle, and stores this power until the second control signal changes to its second state, at which time powering means 120 couples the stored power (energy) to second switching transistor 165. Additionally, powering means 120 may couple the power received during the second state of the second control signal to second switching transistor 165. Alternatively, powering means 120 may operate to only couple the power received by coupling means 115 during the second state of second control signal. There is preferably sufficient energy in the second control signal, as coupled from the magnetic storage element 170 to powering means 120 and stored therein, to enable powering means 120 to maintain second switching transistor 165 in a conductive state for a predetermined period of time.

The power received by means 120 is generally a function of the rate of change (first mathematical derivative) in the magnetic flux of storage element 170. In a preferred embodiment and as indicated above, power transfer circuit 150 alternately increases the magnetic flux in magnetic storage element 170 at a substantially constant rate (positive rate) and then decreases the magnetic flux in the magnetic storage element 170 at a substantially constant rate (negative rate) one or more times during its switching cycle. Powering means 120 is capable of obtaining power during one or both of the positive and negative flux rates.

Drive circuit 100 further comprises a shunting means 130 responsive to the first control signal for causing the second switching transistor 165 to be non-conductive when the first control signal is in its ON state (first state). In this way, because first switching transistor 160 becomes conductive substantially when the first control signal enters its ON state, second switching transistor 165 is rendered non-conductive substantially when first switching transistor 160 is rendered conductive. Shunting means 130 comprises an input port 132 coupled to port 101 for receiving the first control signal, and output having two terminals 133 and 134, which are coupled to second switching transistor 165 through terminals 103 and 104, respectively. Shunting means 130 comprises means responsive to the first control signal for shunting the control terminal of second switching transistor 165 to the first conduction terminal of transistor 165, thereby causing transistor 165 to switch back to its original non-conductive state. As described below in further embodiments of the present invention, shunting means 130 may perform the shunting action with little power from the first control signal and without the need for large volumetric components.

In a preferred embodiment of the present invention, first switching transistor 160 enters its conductive state substantially when the first control signal enters its ON state (first state) and enters its non-conductive state substantially when the first control signal enters its OFF state (second state). Additionally, second switching transistor 165 enters its conductive state substantially when the second control signal enters its second state and enters its non-conductive state substantially when the first control signal enters its ON state. As such, first switching transistor 160 becomes conductive and second switching transistor 165 becomes non-conductive substantially when the first control signal enters it ON state (first state).

First switching transistor 160 becomes non-conductive substantially when the first control signal enters its OFF state (second state), causing the second control signal to enter its second state. This in turn causes second switching transistor 165 to be conductive a time duration after first control signal enters its OFF state (second state). This provides for a non-overlapping operation of switching transistor 160 and 165 in the time when the first control signal enters its OFF state (second state).

In a further preferred embodiment of the present invention, drive means 140 further comprises a delay means for delaying the turn-on of first switching transistor 160 by a predetermined time duration such that first switching transistor 160 enters its conductive state a predetermined time duration after the first control signal enters it ON state (first state). The predetermined time duration is preferably of sufficient length to allow second switching transistor 165 to become non-conductive before first switching transistor 160 becomes conductive. This provides for a non-overlapping operation of switching transistor 160 and 165 in the time when the first control signal enters its ON state (first state).

The second control signal may be generated by power transfer circuit 150 in the following general manner. As mentioned above, transfer circuit 150 comprises electrical power converter sub-unit 180, which includes a control means for generating the first control signal. Power is transferred and/or converted from input port 157 to output port 158 by circuit 150 by way of the operation of magnetic storage element 170, first switching transistor 160, second switching transistor 165, and components within sub-unit 180, by the control logic within sub-unit 180. In operation, the rate of change of the magnetic flux in magnetic storage element 170 is periodically altered by the operation of switching transistors 160 and 165, and sub-unit 180. The magnetic flux preferably increases at a first constant rate (positive rate) during the time the first control signal is in its ON state (first state), and decreases at a second constant rate (negative rate) during the OFF state (second state) of the first control signal. The second control signal may then be coupled from storage element 170, with the second control signal having its states corresponding to the first and second flux rates. As such, the second control signal is a function of the magnetic flux or, more specifically, a function of the flux rate. The rate of change in the magnetic flux may be easily detected, by incorporating an additional winding to the core of magnetic storage element 170, usually on the order of a few turns. In a preferred embodiment of the present invention, coupling means 115 comprises such a winding.

In the preferred embodiments of the present invention, therefore, the second control signal is provided by the flux state of storage element 170, which in turn is controlled by converter sub-unit 180 and first switching transistor 160. With regard to the above-mentioned first control signal, this signal is provided by converter sub-unit 180. Thus, sub-unit 180 coordinates the generation of both the first and second control signals for proper operation of circuit 150. An exemplary sub-unit 180 and this coordination of control signals is provided below with reference to a further embodiment of the present invention.

A second embodiment of the transistor drive circuit according to the present invention is shown at 200 in FIG. 3. Additionally, a second exemplary electrical power transfer circuit is shown at 250 in FIG. 3. Power transfer circuit 250 is an electrical power converter and, more specifically, an active clamp forward converter. Transistor drive circuit 200 comprises ports 201 and 202 corresponding in function to ports 101 and 102, respectively, of drive circuit 100 shown in FIG. 2, and terminals 203-206 corresponding in function to terminals 103-106 of drive circuit 100. Drive circuit 200 further comprises an exemplary means 210 for generating the second control signal, including an exemplary coupling means 215 and powering means 220. Drive circuit 200 further comprises an exemplary shunting means 230 and an exemplary drive means 240. Elements 210, 215, 220, 230, and 240 of drive circuit 200 correspond in function to the elements 110, 115, 120, 130, and 140, respectively, of drive circuit 100. Consequently, the number designation for each of elements 210, 215, 220, 230, and 240 of drive circuit 200 is set to be equal to the number designation of the corresponding element in drive circuit 100 plus a value of one-hundred.

Power converter 250 includes ports 251, 252, 257, and 258 corresponding in function to ports 151, 152, 157, and 158, respectively, of power transfer circuit 150 shown in FIG. 2. Power converter 250 further includes terminals 253-256 corresponding in function to ports 153-156, respectively, of power transfer circuit 150. Additionally, converter 250 comprises a magnetic storage element 270, preferably a power transformer, corresponding in function to element 170 of power transfer circuit 150 (FIG. 2), a first switching transistor 260 corresponding in function to first switching transistor 160 of power transfer circuit 150 (FIG. 2), and a second switching transistor 265 corresponding in function to second switching transistor 165 of power transfer circuit 150 (FIG. 2). Transformer 270 includes a primary winding 271 and a secondary winding 272. Converter 250 further comprises a converter sub-unit, equivalent to sub-unit 180 in FIG. 2, having a control unit 281, a storage capacitor 286, and output rectifiers 292 and 293, and output filter inductor 294, and an output capacitor 295. A specific numerical designation for the sub-unit of converter 250 has not been provided in FIG. 3 in order to simplify the visual complexity of FIG. 3. However, it may be appreciated that the elements 281, 286, 292, 293, 294 and 295 collectively comprise a corresponding sub-unit 280 having a function and connection ports and terminals corresponding to those of sub-unit 180. As described in greater detail below, power converter 250 comprises an active-clamp forward converter, as described in U.S. Pat. No. 4,441,146 to Vinciarelli and U.S. patent application Ser. No. 07/668,587 to Smith.

First switching transistor 260 is coupled between a node 264 and ground. Second switching transistor 265 is coupled in series with capacitor 286, and the series combination is coupled between the $V_{CC}$ supply and node 264. Primary winding 271 is also coupled between the $V_{CC}$ supply and node 264. Transistors 260 and 265 have respective conduction terminals coupled together at node 264. The parasitic capacitance at node 264 associated with these transistors and primary winding 271 is shown at 262 in FIG. 3. In a preferred embodiment of converter 250, first switching transistor 260 comprises a MOSFET device (part number IRF250 manufactured by International Rectifier Corporation) and second switching transistor 265 comprises a MOSFET device (part number IRF220 manufactured by International Rectifier Corporation).

Converter 250 operates to transfer power from input port 257 to output port 258 in the following manner. The supply voltage $V_{CC}$ at port 257 is selectively coupled to the primary winding 271 of transformer 270 by first switching transistor 260, which is known as a primary switch in the switching converter art. First switching transistor 260 is switched in cycles, each cycle comprising an ON period where current is conducted followed by an OFF period where current is blocked. Second switching transistor 265 is switched substantially opposite to first switching transistor 260 and is rendered non-conductive during the ON periods and is rendered conductive during the OFF periods. Transistor 265 is often referred to in the art as the active-clamp switch or the auxiliary switch. In a preferred embodiment of converter 250, a switching period of approximately 2.0 microseconds is used, which corresponds to a switching frequency of approximately 500 KHz for transistors 260 and 265.

During the ON periods, first switching transistor 260 grounds one terminal of the primary winding of transformer 270, causing the supply voltage $V_{CC}$ to be applied to primary winding 271. Additionally, transistor 265 is rendered non-conductive, which places capacitor 286 in a "floating" condition. As a consequence of transformer action, voltage and power from primary winding 271 are applied to secondary winding 272 and directed to the output port 258 through rectifiers 292 and 293, inductor 294, and capacitor 295, as known in the art. Also during the ON periods, the flux through transformer 270 increases in value (positive rate of change), which is due to the magnetizing inductance of transformer 270 and the application of positive voltage to primary winding 271. This places the second control signal in its first state. As is known in the transformer art, a magnetizing current flows through one of the windings of a real transformer to provide the magnetomotive force required to overcome the magnetic reluctance of the transformer's core, and thereby to produce the flux in the transformer's core. This magnetizing current is represented by a corresponding magnetizing inductance of the transformer. As is also known in the transformer art, a real transformer can be modelled by an ideal transformer with the magnetizing inductance coupled in parallel with one of the windings, often the primary winding, of the ideal transformer.

Typically, the flux increases substantially linearly with time during the ON period. The current through first switching transistor 260 comprises the reflected current of secondary winding 272 and the magnetizing current $I_M$ which arises from the above-mentioned magnetizing inductance. Under steady-state operating conditions, the magnetizing current $I_M$ in the active-clamp converter topology is positive at the end of each ON-period and is negative at the end of each OFF period.

During the OFF periods, first switching transistor 260 isolates the primary winding of transformer 270 from ground, and converter 250 places transformer 270 in a "fly-back" or flux-reversing mode. Current continues to flow through primary winding 271, due to the magnetizing inductance, and flows into parasitic capacitor 262 associated with node 264. As a result, the voltage at node 264 increases and the voltage across primary winding 271 decreases. This decrease in primary winding voltage causes the rate of change in the magnetic flux in transformer 270 to decrease. When the voltage across primary winding 271 becomes negative, the rate of change in the magnetic flux becomes negative and the magnitude of the magnetic flux in transformer 270 decreases. This change in magnetic flux state is coupled to drive circuit 200, which causes the second control signal to enter its second state. This in turn causes second switching transistor 265 to be conductive.

When second switching transistor 265 is rendered conductive, the magnetizing current $I_M$ in the primary winding 271 flows into capacitor 286. During steady state operations, the voltage on capacitor 286 reaches a substantially steady value which applies a negative voltage across the primary winding 271 during each OFF period. The application of this negative voltage, which is a reversal in voltage, causes the value of the magnetic flux in transformer 270 to decrease as a function of time. Typically, the flux decreases substantially linearly with time during the OFF period. This causes the flux to be "reset" to a lower (preferably negative) value for the subsequent ON period so that the transformer core does not saturate. This also maintains the second control signal in its second state.

During operation of converter 250, it is preferable that switching transistors 260 and 265 are not rendered conductive at the same time, which would cause the negative voltage from capacitor 286 and the positive voltage of $V_{CC}$ to be applied to primary winding 271 at the same time. As described in greater detail below, drive means 240 and generation means 210 of drive circuit 200 provide means for introducing these "dead periods" in each switching cycle where neither of switching transistors 260 and 265 are conducting. A first dead period is introduced after the end of each ON-period between the time transistor 260 is rendered non-conductive and the time second switching transistor 265 is rendered conductive. A second dead period is introduced at the end of each OFF-period between the time second switching transistor 265 is rendered non-conductive and the time first switching transistor 260 is rendered conductive. During these "dead-periods" the magnetizing current $I_M$ in primary winding 271 is conducted through the parasitic capacitance associated with a node 264.

Control unit 281 and drive circuit 200 operate to switch the first and second switching transistors in the above described manner. Control unit 281 provides a pulse-width modulation (PWM) signal at a port 282 as the first control signal. The first control signal is coupled to port 201 of drive circuit 200, and has a first (ON) state and a second (OFF) state as described above. Control unit 281 varies the duration of the ON state of the first control signal with respect to the OFF state to regulate the output voltage at port 258. For this purpose, control unit 281 monitors the output voltage at a terminal 283 and, optionally, the input voltage at a terminal 284. Exemplary means for varying the duration of the ON state are known to the active clamp converter art. An explanation of such a means is not necessary in order to understand the present invention and enable one of ordinary skill in the art to make and use the same. Control means 281 is powered by the potential difference between terminal 284 and a ground terminal 285 coupled to ground.

A set of timing diagrams showing the time variation of several key voltages $V_A$ through $V_G$ of converter 250 and drive circuit 200 is shown at 300 in FIG. 4. These timing diagrams illustrate the operation of power converter 250 and of drive circuit 200. The voltages $V_A$-$V_G$ are shown at graphs 302-308, respectively. In addition, the characteristic for the transformer flux and magnetizing current $I_M$ is shown as graph 301. In addition, the switching period of approximately 2.0 microseconds in a preferred embodiment of converter 250 is shown at 320 in FIG. 4.

The first control signal at port 201 of drive circuit 200 is indicated at voltage $V_A$ in drive circuit 200 and is shown at graph 302 in FIG. 4. Preferably, the shape of the pulses of the first control signal ($V_A$) is essentially rectangular. The first control signal is coupled to drive means 240 at an input port 241, and to shunting means 230 at a port 232. Drive means 240 comprises a delay unit 740 and a buffer amplifier 245. The first control signal is coupled to an input of delay unit 740, which delays the rising edge of the first control signal. The delayed signal appears at the output of delay unit 740, which is indicated at 742 in FIG. 3. The output of delay unit 740 is coupled to an input of buffer amplifier 245, which amplifies the delayed first control signal. The output of buffer amplifier 245 is coupled to the control terminal (gate) of first switching transistor 260, thus providing the first control signal to transistor 260.

Buffer 245 provides the necessary driving current and voltage for switching first switching transistor 260. Buffer 245 turns on first switching transistor 260 when the delayed pulse is at a high potential. Thus, the length of time first switching transistor 260 is turned on is shorter than the pulse width of the ON state for the first control signal. The output of buffer 245 is designated as voltage $V_B$ in FIG. 3 and appears in graph 303 in FIG. 4. Delay unit 740 generates a delayed pulse in response to each control pulse generated by control unit 281. The rising edge of the delayed pulse is delayed by a predetermined amount of time from the rising edge of the control pulse while the falling edges of the delayed pulse and the control pulse occur at essentially the same time. Thus, the pulse width of the delayed pulse is shorter than the pulse width of the control pulse. The delay occurs between voltage designation points $V_A$ and $V_B$, and can be seen by comparing graphs 302 and 303.

Delay unit 740 preferably comprises a resistor 744 and a diode 746, each having a first terminal coupled to input port 241. Each of diode 746 and resistor 744 has a second terminal, each second terminal coupled to a capacitor 745 and to the input terminal of a Schmitt trigger 747. The other end of capacitor 765 is coupled to ground and the output terminal of Schmitt trigger 767 is coupled to the input of buffer amplifier 245. Diode 746 is oriented such that it is conductive when the potential of capacitor 745 is one diode voltage higher than the potential of input port 241. In a preferred embodiment of drive circuit 200, capacitor 745 has a capacitance value of approximately 470 pF and resistor 744 has a resistance value of approximately 330 ohms.

When the input control pulse is at its rising edge, the potential at the intermediate node between resistor 744 and capacitor 745 rises exponentially because of the RC action. Since the potential at port 241 is higher than the potential at capacitor 745, diode 746 is not conducting. Thus, the potential at capacitor 745 continues to rise to a value approaching the high potential of the pulse. Schmitt trigger 747 outputs a high potential when the exponentially rising signal reaches a predetermined value. Thus, the rising edge of the output pulse is delayed by a predetermined amount of time from the rising edge of the input control pulse.

When the input control pulse is at the falling edge, the potential at the input port 241 is changed to zero. At this time, the potential at the intermediate node between resistor 744 and capacitor 745 is already at a high potential. As a result, diode 746 conducts, preferably with greater conductivity than resistor 744, and the potential of capacitor 745 is pulled down to zero in a short amount of time. In turn, the output of Schmitt trigger 747 is changed to zero. Thus, the falling edge of the output pulse occurs at essentially the same time as the falling edge of the input control pulse in comparison to the delay between the rising edges of the input and output control pulses.

As discussed in greater detail below, second switching transistor 265 is turned off for essentially the full width of each ON state of the first control signal. Thus, switching transistors 260 and 265 operate in an essentially anti-phase relationship, preferably with a short period of time when both switching transistors 260 and 265 are being turned off. That is, switching transistors 260 and 265 do not have any period of time when both are turned on, while there is a short period of time when both are turned off, the above mentioned "dead periods".

The coupling of the magnetic signal from converter 250 to drive circuit 200 and the generation of the second control signal are now described in greater detail. Generation means 210 inside drive circuit 200 includes a port 211 for receiving the magnetic signal from transformer 270 of converter 250 (by way of ports 202 and 252), and an output port having two terminals 213 and 214 for providing the second control signal. Additionally, generation means 210 comprises a winding 215 of transformer 270 of converter 250, which is magnetically coupled by way of port 211. Winding 215 comprises two terminals 216 and 217 for providing an electrical signal indicative of the magnetic signals coupled to it. More specifically, winding 215 generates the second control signal at its terminals 216 and 217 such that the second control signal is in its first state when the magnitude of the magnetic flux of the magnetic storage element is increasing and is in its second state when the magnitude of the magnetic flux is decreasing. The function of winding 215 corresponds to that of coupling means 115 shown in FIG. 2.

Generation means 210 further comprises a powering means 220 coupled between winding 215 and terminals 231 and 214. A voltage $V_D$ is induced across winding 215 as a result of change in the magnetic flux generated by the current flowing through the other windings of transformer 270, particularly primary winding 271. The induced voltage $V_D$ is negative when the second control signal is in its first state and is positive when the second control signal is in its second state. The waveform for voltage $V_D$ is shown at a graph 305 in FIG. 4. In a preferred embodiment of generation means 210, the voltage $V_D$ has a positive value ranging around ~ +3 V during the OFF period and a negative value ranging around ~ −9 V during the ON period.

The induced voltage $V_D$ is coupled to an input port 222 of powering means 220. Powering means 220 comprises a capacitor 225, a rectifier 226, a resistor 227, and an output port having terminals 223 and 224. Terminals 223 and 224 are coupled to terminals 203 and 204, respectively, of drive circuit 200. Port 222 of powering means 220 corresponds to port 122 of powering means 120, shown in FIG. 2, and terminals 223 and 224 correspond to terminals 123 and 124 of powering means 120. One end of capacitor 225 is coupled to output terminal 216 of winding 215. The other end of capacitor 225 is coupled to the cathode of rectifier 226 and resistor 227. The anode of rectifier 226 is coupled to terminal 217 of winding 215 and to output terminal 224 of powering means 220. The other end of resistor 227 is coupled to output terminal 223 of powering means 220. In a preferred embodiment of generation means 210, capacitor 225 has a capacitance value of approximately 0.01 uF and resistor 227 has a resistance value of approximately 470 ohms.

Rectifier 226 rectifies the induced voltage $V_D$ passing through capacitor 225. When the induced voltage $V_D$ across winding 215 is negative, the voltage $V_E$ across diode 226 has a maximum negative value of about $\sim -0.6$ volts and the voltage across capacitor 225 has a maximum positive value equal to the magnitude of the negative induced voltage $V_D$ minus the 0.6 V voltage drop of rectifier 226. In a preferred embodiment of generation means 210, this maximum positive value across capacitor 225 is approximately 8.4 V. When the induced voltage $V_D$ across winding 215 becomes positive, rectifier 226 becomes non-conducting and the previous positive voltage on capacitor 225 is maintained. The positive voltage of capacitor 225 adds to the positive voltage across winding 215 and the maximum possible positive value for voltage $V_E$ is substantially equal to the sum of the positive value of voltage $V_D$ plus the positive voltage of capacitor 225 (which is the magnitude of the negative induced voltage of $V_D$ minus 0.6 V). In a preferred embodiment of drive circuit 200, this maximum possible value for $V_D$ is approximately 11 V. The actual positive value of voltage $V_E$ is typically less than this maximum because of the loading effects of second switching transistor 265 (e.g., capacitive charge sharing). In a preferred embodiment of drive circuit 200, a typical positive value of $V_E$ is approximately 10 V. The waveform for voltage $V_E$ is shown in a graph 306 in FIG. 4.

Due to the rectifying action of rectifier 226, powering means 220 couples power from the second control signal to capacitor 225 when the second control signal is in its first state. Further, powering means 220 couples power from winding 215 during the second state of the second control signal, which is combined with the power stored by capacitor 225. Thus powering means 220 is capable of obtaining power from the second control signal during its first and second states. In this way, power is coupled from the application environment (e.g., converter 250) and selectively delivered to second switching transistor 265.

The voltage $V_E$ is coupled to output terminals 213 and 214 of powering means 220 via resistor 227. In turn, this voltage is coupled to output ports 203 and 204 of drive circuit 200 and, thereby, on to second switching transistor 265. The voltage across terminals 203 and 204 is indicated as voltage $V_F$ in FIG. 3 and is shown at a graph 307 in FIG. 4. However, the voltage $V_F$ does not exactly follow the voltage signal provided by powering means 220 as the voltage $V_F$ is further modified by shunting means 230, which is also coupled to output terminals 203 and 204 of drive circuit 200. Voltage $V_F$ is modified by shunting means 230, as described in greater detail below. Additionally, the voltage $V_F$ across output terminals 203 and 204 has a slightly different time variation than that of voltage $V_E$ due to the voltage drop provided by resistor 227. In a preferred embodiment of drive circuit 200, the voltage $V_F$ has substantially the same positive value as the voltage $V_E$ (e.g., $\sim 10$ V) during the time duration during the latter portion of the OFF period prior to time $t_3$.

Shunting means 230 comprises an input port 232, two output terminals 233 and 234, a pulse transformer 235, a transistor 238, a diode 239, and a pulse generator 730. Port 232 corresponds in function to port 132 of shunting means 130, shown in FIG. 2, and terminals 233-234 correspond in function to terminals 133-134 of shunting means 130. Output terminals 233 and 234 are coupled to output terminals 203 and 204, respectively, of drive circuit 200 and to output terminals 223 and 224, respectively, of powering means 220. Thus, when shunting means 230 becomes a short circuit, voltage $V_F$ across output terminals 203 and 204 becomes essentially zero regardless of the voltage generated by powering means 220. Pulse generator 730 comprises a capacitor 732 and a resistor 734. One end of capacitor 732 is coupled to input port 232 which is in turn coupled to control unit 281 inside power converter 250. The other end of capacitor 732 is coupled to one end of resistor 734. The other end of resistor 734 is coupled to one end of primary winding 236 of pulse transformer 235. The other end of primary winding 236 is coupled to ground.

The two ends of the secondary winding 237 of pulse transformer 235 are coupled to the base and the emitter of transistor 238. In addition, a diode 239 is also coupled between the base and emitter of transistor 238 for protecting the base-emitter junction of transistor 238. The collector and the emitter of transistor 238 are coupled to output terminals 233 and 234, respectively. The base terminal of transistor 238 comprises a control terminal while the emitter and the collector terminals comprise two conduction terminals. In a preferred embodiment of shunting means 230, transistor 238 comprises a bipolar junction NPN transistor (part number BC817) and pulse transformer 235 includes a turns ratio of 10:5 (primary:secondary) and a toroid core (size dimensions T6*3*2). Also in a preferred embodiment of shunting means 230, capacitor 732 has a capacitance value of 470 pF and resistor 734 has a resistance value of 330 ohms.

As mentioned above, control unit 281 generates the first control signal in the form of a series of control pulses. Pulse generator 730 generates a pulse having a positive potential at the rising edge of the control pulse ($V_A$) and a pulse having a negative potential at the falling edge of the control pulse ($V_A$). The RC time constant of resistor 734 and capacitor 732 is chosen to be small when compared to the pulse width of the control pulse. The pulses generated by pulse generator 730 are coupled to primary winding 236 of pulse transformer 235. Pulse transformer 235 functions as a current transformer. As a result, the pulses generated by pulse generator 730 are coupled to the secondary winding 237 of pulse transformer 235. When the pulse at secondary winding 237 is positive, transistor 238 is turned on because the potential at the base of transistor 238 is higher than the potential at the emitter. When there is no pulse at secondary winding 237 or when the pulse is negative, transistor 238 is turned off.

With the above described component values, pulse generator 730 provides a positive pulse at the base of transistor 238 having a peak voltage of $\sim 0.6$ V and a pulse duration of approximately 0.2 microseconds, which is approximately one-tenth of the switching period of 2 microseconds. The voltage generated across the secondary winding 237 of pulse transformer 235 is designated by the voltage $V_G$ in FIG. 3 and is shown at graph 308 in FIG. 4. In a preferred embodiment of the present invention, the pulse duration of 0.2 microseconds is sufficiently long enough for the magnetic state of transformer 270 to change so that the second control signal enters its first state. This causes the voltage $V_E$ provided by powering means 220 to fall to substantially zero volts.

When transistor 238 is turned off, the voltage generated by powering means 220 is not affected by shunting means 230. Since powering means 220 is coupled to the gate and source terminals of second switching transistor 265, the state of second switching transistor 265 is determined by the voltage generated by powering means 220. However, once transistor 238 is turned on, the voltage $V_F$ across terminals 203 and 204 becomes essentially zero. As a result, second switching transistor 265 is turned off regardless of the voltage level generated by powering means 220. Thus, shunting means 230 provides a means to turn off second switching transistor 265 in response to a signal from control unit 281. It may be appreciated that even though a bipolar junction transistor is used in shunting means 230 to shunt the voltage generated by powering means 220, it is possible to use other devices, such as a field-effect transistor (FET) device, in place of the bipolar junction transistor.

In a preferred embodiment of drive circuit 200, transistor 238 of shunting means 230 shunts the voltage $V_F$ to near zero volts to maintain transistor 265 in an off state but does not discharge the charge stored on capacitor 225 of powering means 220 to any great degree. In this embodiment, transistor 238 preferably maintains second switching transistor 265 in an off-state at least until the voltage across transformer primary winding 271 reverses (i.e., the magnetic state reverses), and preferably at least until the voltage $V_E$ provided by powering means 220 falls to substantially zero volts. In this manner, the energy stored on capacitor 225 is not wasted unnecessarily. In a preferred embodiment of drive circuit 200, the resistance of resistor 227 (470 ohms) is chosen with respect to the capacitance of capacitor 225 (0.01 uF) to provide a discharge time constant which is larger than the preferred pulse duration of 0.2 microseconds, which is preferably longer than the time required to reverse the voltage of primary winding 271.

The size of the core and the number of turns of pulse transformer 235 are preferably determined by two requirements. First, the magnetizing inductance of the transformer must be high enough so that the magnetizing current is lower than the current pulse to be transformed. In order to satisfy this requirement, a toroid core with one to five turns is preferably used. Second, the product of the core area and the number of turns of the pulse transformer must be sufficient to support the product of the voltage and the pulse width of the pulses coupled to the pulse transformer. Preferably, the voltage and the pulse width of the pulses coupled to pulse transformer 235 are ~1.2 volt (primary) and 0.2 $\mu$s, respectively. On the other hand, the voltage and the pulse width of the pulses coupled to isolation transformer $T_{ISO}$ are typically 10 volts and 2 $\mu$s, respectively. As a result, the overall volume of pulse transformer 235 is only a quarter of the overall volume of isolation transformer $T_{ISO}$ of the prior art drive circuit. As a further point of comparison between the isolation transformer $T_{ISO}$ by the prior art and pulse transformer 235 by the present invention, the current gain ($H_{FE}$) of transistor 238 greatly reduces the current driving requirements of pulse transformer 235, thus allowing for a smaller core volume. Typical current gate values for transformer 235 range between 30 to 100.

The waveform characteristics of the voltages $V_A$–$V_G$ shown at graphs 302–308, respectively, of FIG. 4 are now described in greater detail. The waveform characteristic for the transformer flux and the magnetizing current $I_M$ shown in graph 301 is also discussed. As the magnetizing current $I_M$ and the transformer flux are substantially proportional to one another, graph 301 shows one characteristic for both.

Graph 302 is a timing diagram of the output voltage $V_A$ of control unit 281. As mentioned above, output voltage $V_A$ comprises a series of control pulses. The nominal duty cycle of the pulse train is preferably less than 50% for efficient operation of the active clamp power converter of FIG. 3. However, as known in the active-clamp art, the duty cycle may be greater than 50% for this type of converter. Voltage $V_A$ rises to a high potential from a ground potential at time $t_1$ and returns from the high potential to the ground potential at time $t_2$. The next control pulse starts at time $t_3$ and ends at time $t_4$.

Graph 303 is a timing diagram of the voltage $V_B$ at the gate terminal of first switching transistor 260. Since buffer 245 only has a negligible effect on the timing of the signal coupled thereto, the pulses shown at graph 303 correspond to the delayed pulses generated by delay means 740. Thus, the rising edges of the delayed pulses of graph 303 start at time $t_5$ and time $t_6$, a short time after $t_1$ and $t_3$, respectively. As explained above, delay means 740 does not delay the falling edges. Thus, the falling edges of the delayed pulses of graph 303 occur essentially at times $t_2$ and $t_4$. Since voltage $V_B$ is the voltage at the gate terminal of first switching transistor 260, graph 303 is also a graph showing the time when first switching transistor 260 is switched on. Thus, first switching transistor 260 is switched on during time intervals $t_5-t_2$ and $t_6-t_4$.

Graph 304 is a timing diagram of the voltage $V_C$ at node 264 connecting the source terminal of second switching transistor 265 and the drain terminal of first switching transistor 260. For clarity of explanation, the description of graph 304 starts at time $t_2$ instead of at time $t_1$. As explained above, right before time $t_2$, first switching transistor 260 is in a conducting (ON) state because it is turned on by voltage $V_B$. Consequently, voltage $V_C$ is essentially equal to zero. At first switching transistor 260 is turned off at time $t_2$ by the output ($V_A$) of control unit 281, the voltage at its drain terminal rises rapidly due to magnetizing current $I_M$ flowing into capacitor 262 (transistor 265 is OFF), as discussed above. This reverses the voltage across primary winding 271 (and the rate of change in the magnetizing flux) which causes generation means 210, and specifically powering means 220, to turn on second switching transistor 265. The primary voltage $V_P$ is essentially the inversion of voltage $V_C$ (i.e., $V_P = V_{CC} - V_C$) and is shown in graph 304 along with voltage $V_C$.

A short time after $t_2$, second switching transistor 265 turns on due to the power provided at node $V_F$ by powering means 220, which in turn is provided in response to the change in flux states at time $t_2$ shown at graph 301. Due to the resistance of resistor 227 and the gate capacitance of second switching transistor 265, voltage $V_F$ rises in a negative-exponential manner (i.e., R-C rise time). At a point in its rise, voltage $V_F$ equals the threshold voltage of transistor 265, and transistor 265 begins to conduct. This turn-on point is shown at $t_7$ in graph 307 of FIG. 4. As a result, node 264 is coupled to storage capacitor 286. As mentioned above, storage capacitor 286 applies an essentially constant, negative voltage to primary winding 271 while transistor 265 is on. This is reflected in a value for voltage $V_C$ which is a constant value above voltage $V_{CC}$. Capacitor 286 applies this voltage during the time interval $t_7-t_3$. As explained above, the core of transformer 270 is reset during this period and the direction of the magnetizing current $I_M$ is reversed. The detailed explanation of the effects of storage capacitor 286 on voltage $V_C$ is described in U.S. Pat. No. 4,441,146 issued to Vinciarelli and U.S. patent application Ser. No. 07/668,587 by Smith. The latter reference is incorporated herein by reference.

Continuing with the description of the $V_C$ waveform shown in graph 304, second switching transistor 265 is turned off by shunting means 230. As described above, shunting means 230 turns off transistor 265 in response to the rising edge at $t_3$ of voltage $V_A$ (first control signal) provided by the output of control unit 281. In the interval from $t_3-t_6$, node 264 is no longer coupled to storage capacitor 286. At the same time, first switching transistor 260 is not yet turned on, as indicated by voltage $V_B$ of graph 303. As a result, voltage $V_C$ decreases because of the discharge of the parasitic capacitance 262 by the reversed magnetizing current $I_M$ in primary winding 271. At time $t_6$, first switching transistor 260 is turned on. Consequently, voltage $V_C$ is now essentially equal to zero. Voltage $V_C$ remains at this potential until first switching transistor 260 is turned off at time $t_4$. The time variation of voltage $V_C$ between time $t_2$ and time $t_4$ repeats itself in graph 304.

Graph 305 is a timing diagram of the voltage $V_D$ across terminals 216 and 217 of winding 215. As explained above, voltage $V_D$ is an induced voltage generated by winding 215 as a result of magnetic flux generated by the current flowing through the other windings of transformer 270. The polarity of the induced voltage $V_D$ is chosen such that voltage $V_D$ is negative when the current flow from $V_{CC}$ to node 264 is an increasing function of time, such as when first switching transistor 260 is turned on. On the other hand, when the current flow from $V_{CC}$ to node 264 is a decreasing function of time, such as when first switching transistor 260 is turned off and the magnetizing current $I_M$ has charged voltage $V_C$ to a value above $V_{CC}$, voltage $V_D$ is positive. Since first switching transistor 260 is turned on only during time intervals $t_5-t_2$ and $t_6-t_4$, as indicated by graph 303, voltage $V_D$ is negative during these two time intervals and is positive during other times. As can be deduced from the transformer laws, the induced voltage $V_D$ has a waveform essentially identical in nature to the waveform for voltage $V_C$ shown in graph 304, except that it is scaled down in magnitude (reduced) and centered about a different average value.

Graph 306 is a timing diagram of voltage $V_E$ across rectifier 226. During time intervals $t_5-t_2$ and $t_6-t_4$, when voltage $V_D$ is negative, voltage $V_E$ has a small negative value because of the rectifier action of rectifier 226. When voltage $V_D$ becomes positive, voltage $V_E$ initially rises to a value equal to voltage $V_D$ plus the voltage on capacitor 225, which was set to the magnitude of the negative voltage of $V_D$ during the preceding ON period. However, due to the loading effects of resistor 227 and the gate capacitance of transistor 265, voltage $V_E$ decreases in value (negative exponential fall time) and settles at a substantially constant value from time $t_2$ to time $t_3$. The settling value is a function of the charge sharing between capacitor 225 and the gate capacitance of transistor 265.

Graph 307 is a timing diagram of the voltage $V_F$ across terminals 203 and 204 of drive circuit 200. As explained above, control unit 281 couples the first control signal to shunting means 230 to turn off second switching transistor 265 by coupling its gate and source terminals together. In graph 307, shunting means 230 turns off transistor 265 at times $t_1$ and $t_3$. Transistor 265 remains off until powering means 220 beings to power transistor 265 at times $t_2$ and $t_4$, respectively. As such, shunting means 230 keeps voltage $V_F$ essentially equal to zero during time intervals $t_1-t_2$ and $t_3-t_4$, as shown in graph 307. During each of the intervals $t_1-t_2$ and $t_3-t_4$, the voltage $V_F$ may become slightly negative ($\sim 0.6$ V) after transistor 238 of shunting means 230 turns off due to the negative voltage across rectifier 226 ($V_E$) during this time. At time $t_2$ (and $t_4$), voltage $V_F$ rises from zero in response to voltage $V_E$, which has been raised to a positive value by powering means 220. As mentioned above, this rise is exponential in nature due to resistor 227 and the gate capacitance of transistor 265. Voltage $V_F$ remains at positive values during time interval $t_2-t_3$. At time $t_7$, voltage $V_F$ increases to the point where transistor 265 becomes conducting. At time $t_3$, voltage $V_F$ is set to zero by shunting means 230 (specifically transistor 238), as explained above, and the time variation of voltage $V_F$ between time $t_1$ and time $t_3$ repeat itself in graph 307.

Since voltage $V_F$ is the voltage at the gate terminal of second switching transistor 265, transistor 265 is turned on when voltage $V_F$ is above a threshold voltage for turning on a MOSFET. Consequently, second switching transistor 265 is turned on shortly after time $t_2$ at time $t_7$ and is subsequently turned off at time $t_3$. As shown in graph 303, first switching transistor 260 is turned on during time intervals $t_5-t_2$ and $t_6-t_4$. Comparing the time intervals when second switching transistor 265 is turned on to the time intervals when first switching transistor 260 is turned off, it can be seen that switching transistors 260 and 265 are driven in antiphase with short dead periods of time when both switching transistors 260 and 265 are turned off. One dead period, the above-mentioned first dead period, occurs between times $t_2$ and $t_7$ and another dead period, the above-mentioned second dead period, occurs between times $t_1$ and $t_5$.

Graph 308 is a timing diagram of voltage $V_G$ across the secondary winding 237 of pulse transformer 235. As explained above, voltage $V_G$ is generated in response to the control pulses shown in graph 302. Voltage $V_G$ comprises pulses 311 and 312 having a positive potential which are generated as a result of the rising edges of voltage $V_A$ at time $t_1$ and time $t_3$, respectively. Voltage $V_G$ also comprises pulses 313 and 314 having a negative potential which are generated as a result of the falling edges of voltage $V_A$ at time $t_2$ and time $t_4$, respectively. The width of pulses 311 and 312 are chosen such that the voltage across transformer primary winding 271 has sufficient time to reverse (i.e., the magnetic state reverses) and the voltage $V_E$ provided by powering means 220 to its output terminals 213 and 214 falls to substantially zero volts, as discussed above. In this manner, the energy stored on capacitor 225 is not wasted unnecessarily. Additionally, the widths of pulses 311 and 312 are preferably less than the duration of the ON period ($t_1-t_2$) so that second switching transistor 265 may be turned on by time $t_7$. Similarly, the widths of pulses 313 and 314 are preferably less than the duration of the OFF period ($t_2-t_3$) so that second switching transistor 265 may be turned off just after time $t_1$. In a preferred embodiment of drive circuit 200, the pulse duration of pulses 311–314 is approximately 0.2 microseconds, which is approximately one-tenth of the switching period. The duration of pulses 311 and 312 are indicated at 321 and 322, respectively, in FIG. 4. Also in a preferred embodiment, the peak voltage of pulses 311 and 312 is $\sim+0.6$ V and the peak voltage of pulses 313 and 314 is $\sim-0.6$ V.

It may be appreciated that other types of switching devices for second switching transistor 265, such a PMOS device or a bipolar Junction transistor device, may be used in practicing the present invention. For example, a PMOS device may used for transistor 265, provided that the gate of the PMOS is coupled to terminal 204 of drive circuit 200 and that the source of the PMOS device is coupled to terminal 203 instead of terminal 204.

Alternatively, third embodiments of the generation means and the shunting means according to the present invention, as shown at 410 and 430 respectively in FIG. 5, may be used to drive the second switching transistor when it comprises a PMOS device. The PMOS second switching transistor is shown at 465 in FIG. 5. Each element of generation means 410 is the same as a corresponding element of generation means 210 of drive circuit 200, shown in FIG. 3. Consequently, the number designation for each element of generation means 410 is set to be equal to the number designation of the corresponding element in generation means 210 plus a value of two-hundred. In a similar manner, each element of shunting means 430 is the same as a corresponding element of shunting means 430 of drive circuit 200, shown in FIG. 3. Consequently, the number designation for each element of shunting means 430 is set to be equal to the number designation of the corresponding element in shunting means 230 plus a value of two-hundred. Switching transistor 465 is preferably an enhancement-mode PMOS device.

One difference between shunting means 430 and shunting means 230, shown in FIG. 3, is that a PNP transistor 438 is used in shunting means 430 in place of NPN transistor 238 of shunting means 230. One difference between generation means 410 and generation means 210 is that the positions of capacitor 425 and resistor 427 of powering means 420 are different from those of capacitor 225 and resistor 227 of powering means 220.

Although the drive circuit means of the present invention is described in the context of an active clamp forward converter, the drive circuit means can also be used with an active clamp flyback converter. Further, the drive circuit means are applicable to other types of power converters comprising two switches which must be driven in anti-phase, i.e., both switches do not turn on at the same time. Additionally, the present invention may be applied to converters comprising a primary switch and a rectifier which conduct opposite to one another and where the rectifier may be replaced by a switching transistor. For example, FIG. 6A shows a conventional buck converter which has been modified for use with the present invention and FIG. 6B shows a conventional boost converter which has been modified for use with the present invention. In each of FIGS. 6A and 6B, the first switching transistor is designated as $Q_{S1}$ and the second switching transistor is designated as $Q_{S2}$. Additionally, each magnetic storage element is designated with corresponding language. The second control signal is derived from the magnetic storage element and the first control signal may be provided by a control unit such as unit 281.

As another set of examples, FIG. 6C shows a forward converter with synchronous secondary rectification and FIG. 6D shows a fly-back converter with synchronous secondary rectification, both of which have been modified for use with the present invention. In each of FIGS. 6C and 6D, the first switching transistor is designated as $Q_{S1}$ and the second switching transistor is designated as $Q_{S2}$. Additionally, each magnetic storage element is designated with corresponding language. The second control signal is derived from the magnetic storage element and the first control signal may be provided by a control unit such as unit 281.

While the present invention has been particularly described with respect to the illustrated embodiments, it will be appreciated that various alterations, modifications and adaptions may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. In a power transfer circuit having a first switching transistor, a second switching transistor, a magnetic storage element electrically coupled to said first switching transistor, and means for generating a first control signal for driving said first switching transistor, said first control signal having a first state and a second state, said first control signal alternating between its said first state and second state, each said switching transistor having a first conduction terminal, a second conduction terminal, a control terminal, a conductive state where current may be conducted between the first and second conduction terminals, and a non-conductive state where current is prevented from being conducted between the first and second conduction terminals, a drive circuit for driving said first and second switching transistors in an anti-phase relationship comprising:

drive means for coupling said first control signal to said control terminal of said first switching transistor, said first control signal causing said first switching transistor to be conductive when said first control signal is in its said first state and to be non-conductive when said first control signal is in its said second state, said magnetic storage element being responsive to the conductive state of said first switching transistor such that the magnitude of the magnetic flux of said magnetic storage element increases when said first switching transistor is conductive and decreases when said first switching transistor is non-conductive;

means for generating a second control signal responsive to the magnetic flux of said magnetic storage element, said second control signal having a first state and a second state, said second control signal being in said first state when the magnitude of the magnetic flux of said magnetic storage element is increasing and in said second state when the magnitude of the magnetic flux of said magnetic storage element is decreasing, said second control signal causing said second switching transistor to be conductive when said second control signal is in its second state; and shunting means coupled to said second switching transistor and responsive to said first control signal for causing said second switching transistor to be non-conductive when said first control signal is in its first state.

2. The drive circuit of claim 1 wherein said first switching transistor enters its conductive state substantially when said first control signal enters its first state and wherein said first switching transistor enters its non-conductive state substantially when said first control signal enters its second state.

3. The drive circuit of claim 2 wherein said drive means further comprises a delay means for delaying the turn-on of said first switching transistor by a predetermined time duration such that said first switching transistor enters its conductive state said predetermined time duration after said first control signal enters its first state.

4. The drive circuit of claim 1 wherein said second switching transistor enters its conductive state substantially when said second control signal enters its second state and wherein said second switching transistor enters its non-conductive state substantially when said first control signal enters its first state.

5. The drive circuit of claim 1 wherein the magnitude of the magnetic flux in the magnetic storage element alternates with time, increasing at a first substantially constant rate during a first portion of a switching cycle and then decreasing at a second substantially constant rate during a second subsequent portion of the switching cycle, and wherein said means for generating said second control signal couples power to the switching transistor in response to a change in flux rates.

6. The drive circuit of claim 1 wherein said means for generating said second control signal comprises an inductor winding magnetically coupled to the magnetic storage element, said winding having first and second terminals.

7. The drive circuit of claim 6 wherein said means for generating said second control signal further includes a powering means for selectively providing power to the control terminal of said second switching transistor to render said second switching transistor conductive, said powering means comprises:

an input port having first and second terminals coupled to said first and second terminals of said inductor winding for receiving said second control signal;

an output port having first and second terminals and being coupled between the control terminal and first conduction terminal of said second switching transistor;

a series combination of a capacitor electrically coupled in series to a rectifier at an intermediate node, said series combination coupled in parallel with said input port; and a resistor coupling said intermediate node to the first terminal of said output port, the second terminal of said output port being coupled to one of the terminals of said input port.

8. The drive circuit of claim 7 wherein said capacitor is coupled between the first terminal of said input port and said intermediate node, wherein the cathode of said rectifier is coupled to said intermediate node and the anode of said rectifier is coupled to said second terminal of said input port, wherein said resistor is coupled between said intermediate node and said first terminal of said output port, and wherein the second terminal of said second port is coupled to the second terminal of said input port.

9. The drive circuit of claim 7 wherein said capacitor is coupled between the second terminal of said input port and said intermediate node, wherein the cathode of said rectifier is coupled to said intermediate node and the anode of said rectifier is coupled to said first terminal of said input port, wherein said resistor is coupled between said intermediate node and said first terminal of said output port, and wherein the second terminal of said second port is coupled to the second terminal of said input port.

10. The drive circuit of claim 1 wherein said shunting means comprises means for coupling the control terminal of said second switching transistor to one of its said conduction terminals in response to said first control signal to render said second switching transistor non-conductive.

11. The drive circuit of claim 10 wherein said means for coupling comprises a shunting transistor having a control terminal responsive to said first control signal, a first conduction terminal coupled to the first conduction terminal of said second switching transistor, and a second conduction terminal coupled to the control terminal of said second switching transistor, said shunting transistor for shunting the control terminal of said second switching transistor to one of said conduction terminals of said second switching transistor in response to said first control signal.

12. The drive circuit of claim 11 wherein said shunting transistor comprises a bipolar transistor having a base as said control terminal, an emitter as said first conduction terminal, and a collector as said second conduction terminal.

13. The drive circuit of claim 11 wherein said shunting means further comprises a transformer having a primary winding coupled to said first control signal and a secondary winding coupled between said control and first conduction terminals of said shunting transistor.

14. The drive circuit of claim 13 wherein said shunting means further comprises a pulse generation means having an input coupled to said first control signal and responsive thereto and an output coupled to said primary winding of said first transformer, said pulse generation means for generating a first pulse state in response to said first control signal changing from its said second state to its said first state and a second pulse state in response to said first control signal changing from its said first state to its said second state.

15. The drive circuit of claim 14 wherein said pulse generation means comprises a series combination of a capacitor coupled in series with a resistor, said series combination coupled between said input and output ports of said pulse generation means.

* * * * *